(12) United States Patent
Rossi et al.

(10) Patent No.: US 7,869,475 B2
(45) Date of Patent: Jan. 11, 2011

(54) MISALIGNMENT PREVENTION IN AN EXTERNAL CAVITY LASER HAVING TEMPERATURE STABILISATION OF THE RESONATOR AND THE GAIN MEDIUM

(75) Inventors: Giacomo Antonio Rossi, Milan (IT); Sergio Walter Grassi, Milan (IT)

(73) Assignee: PGT Photonics S.p.A., Milan (IT)

( * ) Notice: Subject to any disclaimer, the term of this patent is extended or adjusted under 35 U.S.C. 154(b) by 7 days.

(21) Appl. No.: 12/306,543

(22) PCT Filed: Jul. 12, 2006

(86) PCT No.: PCT/EP2006/006812

§ 371 (c)(1),
(2), (4) Date: Dec. 24, 2008

(87) PCT Pub. No.: WO2008/006387

PCT Pub. Date: Jan. 17, 2008

(65) Prior Publication Data

US 2009/0252188 A1    Oct. 8, 2009

(51) Int. Cl.
*H01S 5/14*     (2006.01)
*H01S 5/024*    (2006.01)
*H01S 5/02*     (2006.01)
*H01S 5/22*     (2006.01)
*H01S 5/0683*   (2006.01)

(52) U.S. Cl. ................ 372/34; 372/32; 372/36; 372/102

(58) Field of Classification Search ................ 372/34, 372/36, 32, 102
See application file for complete search history.

(56) References Cited

U.S. PATENT DOCUMENTS

| | | | |
|---|---|---|---|
| 6,496,524 B2* | 12/2002 | Miyokawa et al. | 372/36 |
| 6,729,143 B1* | 5/2004 | Watts et al. | 62/3.2 |
| 7,505,490 B2* | 3/2009 | Romano et al. | 372/20 |
| 2002/0048297 A1* | 4/2002 | Irie et al. | 372/36 |
| 2002/0118714 A1 | 8/2002 | Kanamaru et al. | |
| 2005/0190810 A1* | 9/2005 | Butterworth et al. | 372/70 |
| 2006/0045151 A1 | 3/2006 | Vakhshoori et al. | |
| 2006/0088069 A1* | 4/2006 | Vakhshoori et al. | 372/32 |

FOREIGN PATENT DOCUMENTS

WO    2006002663 A1    1/2006

\* cited by examiner

*Primary Examiner*—Minsun Harvey
*Assistant Examiner*—Michael Carter
(74) *Attorney, Agent, or Firm*—Volpe and Koenig, P.C.

(57) ABSTRACT

The present invention relates to an external-cavity laser module comprising a thermoelectric cooler (TEC) including an upper carrier plate having an upper surface, said TEC being configured to stabilize the temperature of the upper surface at a substantially constant temperature. The laser module further comprises a laser assembly mounted on an optical bench, which is in thermal coupling with said upper surface, said laser assembly comprising a gain medium for emitting an optical beam into the external cavity and an end mirror.

16 Claims, 7 Drawing Sheets

MISALIGNMENT PREVENTION IN AN EXTERNAL CAVITY LASER HAVING TEMPERATURE STABILISATION OF THE RESONATOR AND THE GAIN MEDIUM

The invention relates to an external-cavity laser and in particular to an external cavity tuneable laser that is especially adapted as optical transmitter for wavelength-division multiplexed optical communication networks.

RELATED ART

The use of lasers as tuneable light source can greatly improve the reconfigurability of wavelength-division multiplexed (WDM) systems or of the newly evolved dense WDM (DWDM) systems. For example, different channels can be assigned to a node by simply tuning the wavelength. Also, tuneable lasers can be used to form virtual private networks based on wavelength routing, i.e., photonic networks.

Different approaches can be used to provide tuneable lasers, such as distributed Bragg reflector lasers, VCSEL lasers with a mobile top mirror, or external-cavity diode lasers. External-cavity tuneable lasers offer several advantages, such as high output power, wide tuning range, good side mode suppression and narrow linewidth. Various laser tuning mechanisms have been developed to provide external-cavity wavelength selection, such as mechanically adjustable or electrically activated channel selector elements.

U.S. Pat. No. 6,526,071 describes an external-cavity tuneable laser that can be employed in telecom applications to generate the centre wavelengths for any channel on the International Telecommunications Union (ITU) grid. The disclosed tuneable laser includes a gain medium, a grid generator and a channel selector, both grid generator and channel selector being located in the optical path of the beam. The grid generator selects periodic longitudinal modes of the cavity at intervals corresponding to the channel spacing and rejects neighbouring modes. The channel selector selects a channel within the wavelength grid and rejects other channels. The grid generator is dimensioned to have a free spectral range (FSR) corresponding to the spacing between gridlines of a selected wavelength grid (an ITU grid) and the channel selector is dimensioned to have a FSR broader than that of the grid generator which is itself broader than the FSR of the cavity.

Typically, the grid generator is a Fabry-Perot etalon defining a plurality of transmission peaks (also referred to as passbands) defining periodic longitudinal modes. To select a periodic longitudinal mode (i.e., a lasing channel on the ITU grid), several channel selecting mechanisms have been considered, including rotating a diffraction grating, mechanically translating a wedge-shaped etalon, or varying the voltage or current supplied to an electro-optically controlled element.

J. De Merlier et al. in "*Full C-Band External Cavity Wavelength Tunable Laser Using a Liquid-Crystal-Based Tunable Mirror*", published in IEEE Photonics technology Letters, vol. 17, No. 3 (2005), pages 681-683, disclose an external cavity tuneable laser containing a fixed etalon with a FSR of 50 GHz and a liquid crystal (LC) based tuneable mirror. The tuneable mirror is an optical resonator that works in reflection, exhibiting one reflection peak over a wide wavelength range which can be tuned over the whole C-band by adjusting the amplitude of the ac voltage signal. The laser consists of a chip containing a gain and a phase section. The integration of the phase control on the chip avoids the need for mechanical tuning of the cavity length.

An external cavity tuneable laser with an etalon as grid generator and an LC-based tuneable mirror is described in WO patent application No. 2005/041371.

In order to accommodate increasing optical communication traffic, DWDM systems with channel spacing of 50 GHz and even of 25 GHz have been recently developed. As DWDM uses narrower channel spacing, wavelength (frequency) accuracy of transmitter lasers over the entire tuning (e.g., the C-band) and operating temperature range has become an important issue. DWDM systems with 50 GHz channel spacing typically require an accuracy of ±2.5 GHz about the lasing frequency, whereas systems with 25 GHz generally require a frequency accuracy of ±1.25 GHz.

As tuneable elements are configured for narrower channel separation, decreasing component tolerances and thermal fluctuations become increasingly important. Spatial misalignments of optical components of the laser device may arise from temperature variations due to expansions and contractions associated to the various components, which will reduce wavelength stability and generally reduce the performance of the laser. The laser response needs to be stabilised across a relatively wide temperature range, typically ranging from −5° C. to 70° C. To ensure thermal stability, many telecommunication laser devices are mounted on a common platform, which exhibits high thermal conductivity and is subject to the thermal control of one or more thermo-electric coolers (TECs). Temperature control allows for maintenance of thermal alignment of the optical components.

In an external cavity laser, a resonant external cavity is formed with optical path length $L_{opt}$ between a first mirror, typically the reflective rear surface of the gain medium, and a second mirror, the end mirror. The free spectral range (FSR) of the laser cavity, i.e., the spacing between the cavity modes, depends on the optical path length, owing to the relation $$(FSR) = \frac{c_0}{2L_{opt}} \quad (1)$$

wherein $c_0$ is the speed of light in vacuo.

The optical path length of an external cavity laser is a sum of the products of indices of refraction and optical thicknesses of the various elements or components present in the optical path across the external cavity, including the air present within the cavity. Thus, the optical path length of the laser cavity can be shown as $$L_{opt} = \Sigma_i n_i L_i \quad (2)$$

where $n_i$ (i=1, . . . , m) is the refractive index of the medium filling the $i^{th}$-optical element (component) that the light encounters in the cavity and of the cavity itself (i.e., the free space, $n_{FS} \approx 1$), while $L_i$ is the thickness of the $i^{th}$-element and the physical length the light travels in free space (i.e., the free-space physical length). The external cavity can be thought of as an optical resonator composed of two confronting and reflective, generally parallel, surfaces separated by a length, which is defined as the physical length of the cavity, $L_0$. In general, $L_{opt} \geq L_0$.

U.S. Pat. No. 6,658,031 discloses a laser apparatus that uses an active thermal adjustment of a laser cavity reflective element to minimise losses and provide wavelength stability. A compensating member is coupled to a reflector and configured to thermally position the one reflector with respect to the other reflector in order to maintain an optical path length that does not vary with temperature (except during active thermal control of the compensating member). The thermal positioning may be carried out by a thermoelectric controller operatively coupled to the compensating member and configured to thermally adjust the compensating member by heating or cooling thereof.

In U.S. Pat. No. 6,724,797, an external-cavity laser device is disclosed, wherein selective thermal control is applied to optical components having a high susceptibility to thermal misalignments. The gain medium and the optical output assembly, which are temperature sensitive components, are mounted on a thermally conductive substrate. A TEC is coupled to the substrate to allow for the gain medium and the output assembly to be thermally controlled independently from the end mirror and other components of the external cavity laser. Components of the external cavity, which are thermally isolated from the thermally conductive substrate, may comprise a channel selector and a tuning assembly.

From Eq. (2) it can be seen that $L_{opt}$ may be adjusted by physical adjustment of the spacing between the two end mirrors defining the external cavity and/or by adjusting the refractive index of the material present in the external cavity. Semiconductor gain media such as InGaAs and InGaAsP have generally high refraction indices that exhibit relatively large variations with temperature and therefore can significantly contribute to the overall external cavity optical path length.

U.S. Pat. No. 6,763,047 describes an external cavity laser apparatus that uses an active thermal adjustment of the external cavity to minimise losses and provide wavelength stability. The apparatus of the cited patent includes a thermally conductive platform, a gain medium and an end mirror thermally coupled to the platform and a thermoelectric controller thermally coupled to the platform and configured to cause the platform to expand and contract in response to a temperature change of the platform, thereby adjusting the optical path length of the cavity. Heating or cooling of the platform by the thermoelectric controller provides temperature control of the gain medium refractive index via thermal conduction with gain medium and/or thermal expansion or contraction of the platform to control the spacing between the end mirrors. A control element is operatively coupled to the thermoelectric controller to provide control instructions regarding heating or cooling of the platform, and hence of the gain medium.

Thermo-electric coolers for use in an optical assembly generally include a Peltier cell. A Peltier cell is a well known semiconductor junction device that can produce heat or cold on one of it surfaces depending on the direction of the current applied to it and independently of the environmental temperature. The change of temperature is achieved by the use of the well-known Peltier effect, in which a lower temperature is created on one side of a semiconductor junction array or layer, and an elevated temperature on the opposite side. This essentially leads to a transfer of heat to or from a first surface from or to an underlying substrate or structure. The temperature of the first surface can thereby be changed, either increased or decreased, by a current applied to the device, in the appropriate direction. To increase the effect, it is necessary to increase the current density. Thus, by the mere exertion of an electrical current, the temperature of the first surface can adaptively be adjusted and changed. This effect is reversible. If the direction of current is changed, the original cooling side will become the heating side and the heating side becomes the cooling side.

A standard construction of a TEC comprises two ceramic carrier plates with a series of P- and N-doped semiconductor materials (i.e., the Peltier cell), typically consisting of several hundred PN couples of bismuth-telluride semiconductor material, sandwiched between them.

In the situation where there is a temperature gradient between the top and the bottom surfaces of the TEC, the cooler itself begins to deform. Because an optical bench is typically supported on the top surface of a TEC, this may lead to deformation of the optical bench itself.

U.S. Pat. No. 6,729,143 describes a TEC for use in an optical assembly where the top surface of the cooler is divided into regions separated by gaps, each region having a neutral region with lower deformation with temperature variation.

US patent application No. 2001/0038653 discloses a laser diode module comprising a laser diode chip mounted on a heat sink, a TEC for controlling the temperature of the laser diode chip to a predetermined temperature and an optical fibre for guiding the laser beam to the outside via the optical coupling means, wherein the heat sink and the optical coupling means are mounted on a mounting surface of the TEC. The laser diode chip is mounted closer to the centre of the mounting surface of the TEC than the coupling means and the coupling means is mounted on the TEC with a base interposed therebetween and a portion of said base partly extends beyond the mounting surface.

Japanese patent application No. 04/253388 discloses a semiconductor laser module comprising a Peltier device, a base on which a chip carrier is fixed and a deformable damper placed in between the Peltier device and the base so as to allow the thermal stress which occurs in the base and in the Peltier device due to temperature changes to be absorbed by the damper.

SUMMARY OF THE INVENTION

The present invention relates to an external cavity laser assembly comprising a gain medium, which is in thermal coupling to a thermoelectric cooler (TEC). Preferably, an end mirror of the laser assembly is in thermal coupling to the thermoelectric cooler.

The gain medium is preferably a semiconductor gain medium, such as a semiconductor laser chip. Due to environmental thermal fluctuations and to heating generated during operation, semiconductor gain media undergo thermal fluctuations that in turn induce variations of the refractive index with consequent changes of the optical path length of the laser external cavity. In order to improve temperature stability, the gain medium is thermally coupled to a TEC that provides the gain medium with thermal control. The TEC comprises a surface in thermal coupling with the gain medium so that excessive heating of the gain medium can be dissipated through the TEC, which is operatively arranged so as to maintain said TEC surface at a substantially constant temperature. As it will become clearer from the following discussion, thermal coupling (or thermal contact) between an element and the TEC means that a heat flow path exists between that element and the TEC thermally stabilised surface. The heat flow path, which is defined by a thermal resistance, takes place across thermally conductive materials.

For thermal stabilisation, operation of the Peltier cell is set so that the temperature of one of its sides is maintained at the same temperature within a given narrow temperature range, e.g., 25° C.±0.1° C. or 22° C.±0.5° C. Considering a typical construction of a TEC including a Peltier cell, this means that one of the TEC carrier plates is thermally stabilised, said carrier plate including a surface, hereafter referred to as the thermally stabilised surface, which the gain medium of the external cavity laser, and preferably also the end mirror, is in thermal coupling to. The TEC carrier plate maintained at a substantially constant temperature will be referred to as the "upper" carrier plate with respect to the Peltier cell, whereas the carrier plate at about the environmental temperature will be referred to as the "lower" plate, reflecting a typical orientation of a thermally controlled laser cavity. Typically, the two carrier plates are of thermally conductive ceramic, such as AlN or $Al_2O_3$.

Environmental temperature variations may induce mechanical deformations of the thermally stabilised surface of the TEC, i.e., of the thermally stabilised TEC carrier plate. Said deformations are due to a temperature difference between the surface maintained at a substantially constant temperature and the lower surface underlying the semiconductor array (i.e., the lower carrier plate), which is at the environmental temperature. Depending also on the thermal expansion coefficient of the material making the two carrier plates of the TEC, the bigger the difference between the substantially constant temperature and the environmental temperature, the larger the mechanical deformation. As a result, a warpage, i.e., a change of flatness, of the TEC upper carrier plate is induced.

The gain medium is placed on a thermally conductive platform (also referred to as the optical bench), which is in thermal coupling with the thermally stabilised surface of the TEC. In case of a thermally conductive platform mounting the gain medium (either directly or through a submount), mechanical deformations of the upper carrier plate can be transmitted to the thermally conductive platform. The magnitude of the transmitted compressive or tensile strain depends on the Young's modulus and on the thickness of the thermally conductive platform. For instance, computer simulations have shown that an AlN optical bench having a 0.8 mm thickness and a Young's modulus of 330 GPa and being placed on a thermally stabilised surface is affected by mechanical deformation.

On the other hand, a highly rigid platform (e.g., a CVD-diamond base plate with Young's modulus of about 1050 GPa or a SiC base plate with Young's modulus of about 470 GPa) would be less or not significantly affected by deformations in the underlying layers. Similarly, a thermally conductive platform having a relatively large thickness, e.g., larger than about 1.5 mm, would to a large extent dampen down the deformations occurring in the underlying TEC carrier plate. However, thermally conductive platforms suitable as optical benches for laser assemblies made of a material having very large Young's modulus, e.g., CVD-diamond or SiC, are also very expensive. On the other hand, optical benches having relatively large thickness often do not match the package constraints.

Mechanical deformations of the thermally conductive platform on the TEC in turn induce variations in the optical path length of the laser cavity, mostly due to variations of the free-space physical length. For instance, a variation of the environmental temperature from 25° C. to 70° C. may lead to a reduction of the optical path length from a few tenths of micron to more than 2 μm, depending on several factors, such as the surface area of the TEC upper carrier plate and the thickness of the optical bench. For example, for a TEC having an upper and lower carrier plate of AlN and a Peltier cell of bismuth telluride elements, where the upper carrier plate has a surface area of T×S=15×7 $mm^2$ and a thickness of 1.2 mm, a temperature difference between the upper and the lower carrier plates of 53° C. (e.g., the thermally stabilised upper plate is at 25° C.) causes a variation of the lengths of the upper carrier plate of δT=3.4 μm and δS=1.6 μm in the non operative condition.

In external-cavity tuneable lasers for WDM systems, variations of the cavity optical path length cause an offset of the cavity mode from the centre of the (selected) etalon peak. Such an optical misalignment of the cavity modes introduces optical losses that lead to a drop in the output power at the selected lasing channel, which can be unacceptable when a stable output at selectable wavelengths during laser operation is required. The optical misalignment involves also a frequency shift of the output frequency (i.e., the lasing wavelength), such as a shift ranging for instance from 100 MHz to 1 GHz.

Although a possible solution resides in using an electronically controlled component coupled to an optical element of the laser cavity (e.g., a piezoelectric actuator that adjusts the position of the end mirror), in order to compensate for the optical path length changes, active adjustments would introduce complexity in the laser package, thereby increasing the manufacturing costs.

Centering of the lasing channel could be attained by monitoring the laser output power and by making adjustments of the injection current of the gain medium, until the power is maximised. However, the Applicant has observed that when deformations of the TEC upper plate are more pronounced because of a relatively large temperature gradient between the stabilised temperature and the environmental temperature (e.g., more than 20° C.; within the operative temperature range, gradients can be up to 45-50° C.), the adjustments of the injection current necessary to compensate the optical effect of the deformations are relatively large, e.g., up to about 60-70 mA. It follows that the variations of the optical power needed to restore the alignment condition are significant and can adversely affect the stability of the laser output by introducing relatively large fluctuations, e.g., of 1 dB, in the output optical power.

The Applicant has therefore understood the need of reducing the effect of mechanical deformations so that adjustments of the injection current of the gain medium are either unnecessary or at least can occur within a narrow range of values, preferably within about 10 mA and more preferably within 5 mA. In this way, the stability of the lasing signal is not adversely affected.

FIG. 1 schematically illustrates a typical configuration of a thermally controlled external cavity laser. The external cavity laser 1 includes a semiconductor gain chip 2 as gain medium emitting a light beam and an end mirror 3, the gain medium and the end mirror being thermally coupled to a thermoelectric cooler 4. The gain medium 2 is placed on a thermally conductive submount 9, which is placed on a thermally conductive platform or optical bench 10. The end mirror 3 is also placed on the optical bench 10. The thermoelectric cooler (TEC) 4 includes a Peltier cell 7, an upper carrier plate 5 including a thermally stabilised surface 6, the temperature of said surface being maintained at a given temperature, $T_1$, and a lower carrier plate 8 placed at the environmental temperature, $T_{env}$. "Upper" and "lower" plates, 5 and 8, with respect to the Peltier cell 7 are referred to a typical orientation of a thermally controlled laser cavity, i.e., the one shown in FIG. 1. The optical bench 10 is in thermal contact with the thermally stabilised surface 6 of the TEC 4, e.g., it is bonded to the upper carrier plate 5, so as to ensure a negligible thermal resistance between them. The surface area of the thermally stabilised surface 6 is such that the laser cavity is placed directly above the thermally stabilised upper carrier plate 5, i.e., both the gain medium 2 and the end mirror 3 are mounted on the surface area of the optical bench 10 placed above the upper carrier plate. In other words, the gain chip and the end mirror are placed at zero distance from the upper carrier plate 5 along the main longitudinal direction of the upper carrier plate, which is typically, but not necessarily, substantially parallel to the main optical axis of the optical beam within the laser cavity. Assuming that both the optical bench and the submount have a thermal conductivity not smaller than about 120 W/mK (such as in case of typical thermally conductive materials employed in laser assemblies, for instance an optical bench of AlN and a submount of SiC), the end mirror is thermally stabilised at substantially $T_1$ (e.g., $T_1 \pm 0.1°$ C.), while the temperature of the gain medium can slightly differ from $T_1$, for example of about +1° C., due to heating of the semiconductor chip during operation.

In the case depicted in FIG. 1, mechanical deformations caused by the temperature difference, $\Delta T = (T_{env} - T_1)$, induce an increase or decrease (depending on the sign of $\Delta T$) of the optical path length, $L_{opt}$.

The Applicant has noticed that the magnitude of the mechanical deformations increases with increasing the surface area of the upper carrier plate of the TEC. Deformations along the longitudinal direction of the main optical axis of the optical beam within the laser cavity (i.e., the longitudinal direction crossing the emitting side of the gain medium and the end mirror) affect the optical path length of the laser cavity. Starting from that observation, the Applicant has considered a TEC of reduced surface dimensions. FIG. 2 illustrates the case of a TEC 4' having an upper carrier plate 5' and a lower carrier plate 8'. A Peltier cell 7' is sandwiched between the upper and the lower carrier plate. The upper carrier plate 5' has a length along said longitudinal direction significantly smaller than that of the optical bench 10 mounting the laser assembly so that both the gain chip and the end mirror are not placed directly above the TEC upper carrier plate 5'. The same reference numerals are given to elements of the laser module corresponding to those shown in FIG. 1 and their description is omitted.

A laser cavity in thermal contact with a TEC having a thermally stabilised surface much smaller than the area occupied by the laser cavity (e.g., <50%) is largely unaffected by mechanical deformations. However, the use of a TEC with a thermally stabilised surface area much smaller than the area occupied by the laser cavity can come at the cost of a reduced thermal stability. Thermal instability caused by the heat generated during operation of the gain medium and in general by a larger sensitivity of the optical components to external thermal fluctuations leads to an instability of the phase of the laser cavity and thus of the lasing frequency.

In case of external cavity lasers, the upper carrier plate of a TEC may need to carry an optical bench that accommodates a plurality of optical elements, such as an end mirror and one or more collimating lenses. In tuneable external cavity lasers especially adapted as optical transmitter for WDM/DWDM systems, optical elements may also comprise a grid generator and a tuneable element. A TEC of significantly reduced dimensions (as in the case illustrated in FIG. 2) has a Peltier cell including fewer semiconductor elements and it is thus intrinsically more fragile when bearing an optical bench carrying a plurality of components, thereby making the laser package to be more vulnerable to damage caused by external mechanical shocks.

The Applicant has understood that the effect of mechanical deformations, i.e., the variation in the optical path length of the laser cavity, can be at least partially compensated by mechanically decoupling the optical bench from the upper surface of the TEC (i.e., the thermally stabilised surface of the upper carrier plate), while maintaining a thermal coupling between the TEC and the optical bench so as to ensure an efficient thermal stabilisation of the laser cavity.

The Applicant has found that mechanical decoupling is achieved by interposing an intermediate plate between the optical bench and the upper carrier plate of the TEC, said intermediate plate having a first surface facing the upper carrier plate having a smaller surface area than the thermally stabilised surface of the upper carrier plate. In particular, the intermediate plate has a length along a main longitudinal direction of the upper carrier plate, which is preferably substantially parallel to the main optical axis of the optical beam within the laser cavity, said length being smaller than the length of the thermally stabilised surface along the same direction.

The intermediate plate is made of a thermally conductive material so as to ensure the thermal coupling between the TEC and the optical bench.

Computer simulations have shown that mechanical deformations have a larger magnitude in the proximity of the edges than in the central region of the upper carrier plate, in such a way that the upper carrier plate, when deformed, generally forms a concave surface for $\Delta T$ larger than zero and a convex surface for $\Delta T$ smaller than zero. According to a preferred embodiment, the intermediate plate is placed on the TEC upper carrier plate so that both edges of the intermediate plate along the main longitudinal direction of the optical axis of the laser cavity are spaced of at least 2 mm from the closest edge of the upper carrier plate along the same direction. More preferably, the distance between the closest edge of the upper carrier plate and each edge of the intermediate plate along the main longitudinal direction is of at least 2.5 mm.

Preferably, the intermediate plate is placed on the upper carrier plate substantially centred with respect to the length of the upper carrier plate along the main optical axis of the laser cavity. It is however to be noted that a symmetrical position of intermediate plate with respect to the edges of the upper carrier plate along the main longitudinal direction of the thermally stabilised surface is not necessary as long as the intermediate plate is not close to the edges. Since the magnitude of mechanical deformations for a given temperature gradient, $\Delta T$, depends also on the size of the TEC carrier plate, it is preferred that the length of the upper carrier plate along the main longitudinal direction is not greater than 15 mm.

According to a preferred embodiment, the laser assembly comprising the gain medium and an end mirror is placed on a common thermally conductive platform, i.e., an optical bench, which is in thermal contact with the thermally stabilised surface of a TEC.

The present invention has the advantage that compensation of the variations of the optical path length of the laser cavity due to mechanical deformations is carried out passively, without the need of introducing an active thermal control and/or an extra electronic control circuit.

It is to be noted that compensation of the variation of the optical path length of the laser cavity according to the present invention can be also partial, i.e., in the direction of a significant decrease of said variation without reducing it to zero. Also when partial compensation is achieved by the present solution, it will be possible to achieve full compensation by making only small adjustments of the injection current of the gain medium, thereby avoiding creation of relatively large fluctuations in the laser output optical power. Preferably, injection current adjustments are within about ±10 mA and more preferably within ±5 mA.

DESCRIPTION OF THE PREFERRED EMBODIMENTS

Figure 1:
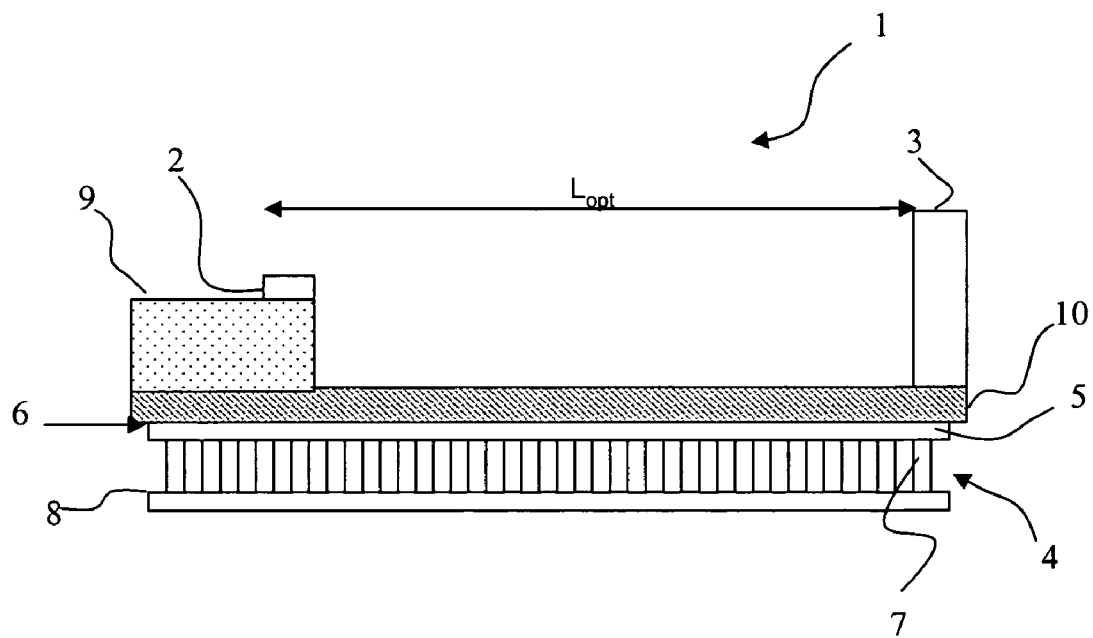
FIG. 1 is a schematic diagram illustrating a laser external cavity thermally stabilised by means of a thermoelectric cooler.
Figure 2:
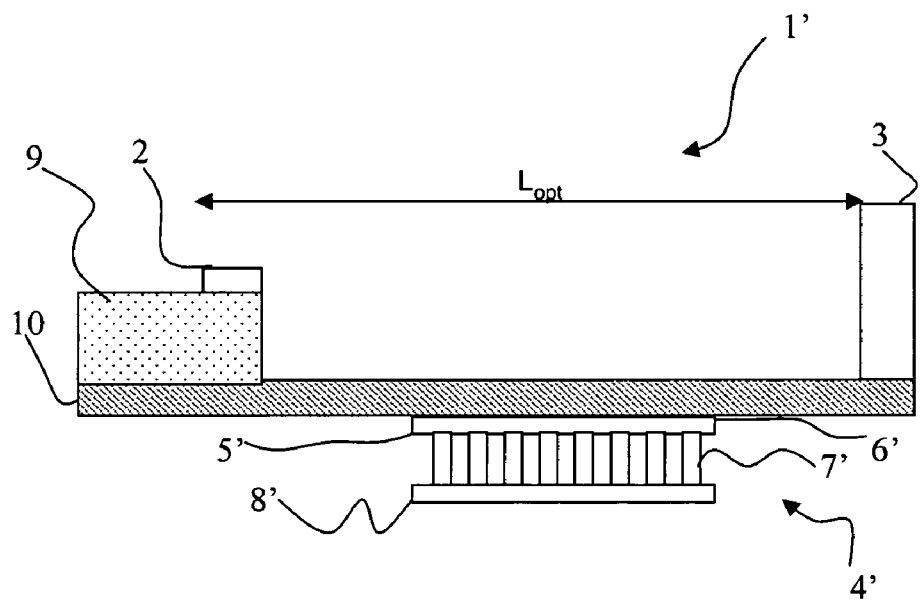
FIG. 2 is a schematic diagram illustrating the laser external cavity of FIG. 1, in which thermal stabilisation is lessened due to a thermoelectric cooler of reduced dimensions with respect to the laser cavity.
Figure 3:
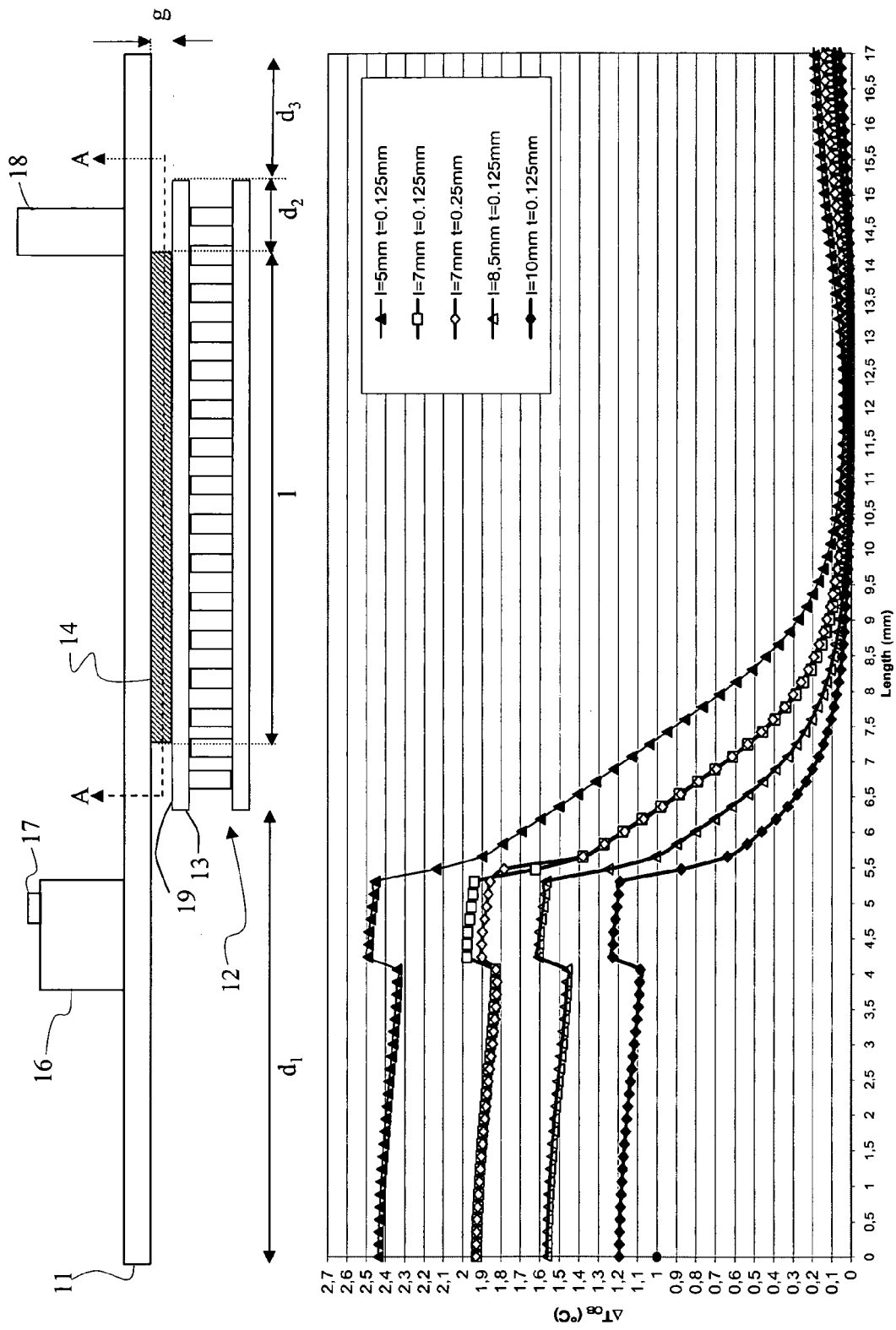
FIG. 3 shows computer simulations of the temperature as a function of the position along the length of an optical bench mounting an external cavity along the main longitudinal direction of the optical bench, which is substantially parallel to the main optical axis of the optical beam within the cavity, for a laser module configuration according to an embodiment of the present invention.

FIG. 3 shows results from computer simulations (by using a finite-element analyser) of the temperature curves, i.e., temperature variation, $\Delta T_{OB}$, vs. position along the length of an optical bench mounting a laser assembly, wherein $\Delta T_{OB} = (T_{OB} - T_1)$ and $T_{OB}$ is the temperature measured on the optical bench upper surface. The upper part of the figure schematically illustrates (not to scale) the configuration of the laser module considered in computer simulations. Optical bench 11 is placed on a TEC 12 with surface area of the thermally stabilised surface 19 of 12.2×7 mm², i.e., the TEC upper carrier plate 13 is a rectangular-shaped plate having a main longitudinal direction along the X-axis, said surface being stabilised at a temperature $T_1 = 25°$ C. Simulations are carried out at an environmental temperature of $T_{env} = 70°$ C., i.e., $\Delta T = 45°$ C. The optical bench 11 is a rectangular-shaped plate of length of 17 mm along the longitudinal main direction of the optical bench (i.e., the X axis), of width of 7 mm and thickness of 0.8 mm. The distance, $d_1$, from the left edge of the optical bench along the X-axis to the left edge of the upper carrier plate is of 7.2 mm. A laser chip 17 is placed on a thermally conductive submount 16 about 2 mm thick, which is placed on the optical bench 11. The laser chip has an output power of 400 mW and is placed on the optical bench at about 4.2 mm from its left edge along the X axis. The optical bench 11 and the upper carrier plate 13 are assumed to have a thermal conductivity of about 180 W/mK, while the submount 16 is assumed to have a thermal conductivity of 160-190 W/mK. The laser cavity includes an end mirror 18, which is placed on a surface region of the optical bench at a zero longitudinal distance along the X-axis from the thermally stabilised surface of the TEC. The main optical axis of the laser cavity, i.e., the longitudinal direction crossing the gain medium and the end mirror, is substantially parallel to the X direction.

An intermediate plate 14 is placed between the TEC upper carrier plate 13 and the optical bench 11. The intermediate plate is thermally conductive and in calculations it is assumed to have the same thermal conductivity as the optical bench. Simulations were performed with different values of the length, l, along the X axis, of the intermediate plate, in a range from 5 to 10 mm. The intermediate plate is positioned on the carrier plate 13 substantially centred along to the X axis. Two thickness values, t, of the intermediate plate were considered, namely 0.125 mm and 0.25 mm. The width of the intermediate plate is taken to be substantially equal to that of the optical bench.

An increase of the temperature in correspondence to the laser chip can be seen in all curves representing the simulation results (bottom part of FIG. 3), due to self-heating of the gain chip during operation and to the fact that the gain chip is positioned at a certain distance, $d_4$, from the TEC thermally stabilised surface (namely of about 3 mm). If the laser chip had been positioned on a surface region of the optical bench at a zero longitudinal distance from the thermally stabilised surface of the TEC, the temperature gradient would have been smaller for all the considered dimensions of the intermediate plate.

As explained more in detail in the following, it is preferred to position the laser chip at a certain distance from the thermally stabilised surface of the TEC along the main direction of the optical beam within the laser cavity. However, it is to be understood that the present invention envisages also the case where the laser module is provided with a gain medium positioned on the optical bench in correspondence with the TEC upper carrier plate.

FIG. 3 shows that, for a given thickness, to a smaller value of the length of the intermediate plate there corresponds a larger temperature gradient on the laser chip. For l=10 mm (solid diamonds), the temperature difference measured on the optical bench, $\Delta T_{OB}$, is of about 1.2° C., whereas for l=5 mm (solid triangles), the temperature difference is of about 2.5° C. Furthermore, for a given length, i.e., l=7 mm, an increase in thickness of the intermediate plate leads to a slight increase of the temperature difference (comparison between open squares and open diamonds). Although not shown in the figure, a more significant difference in temperature variation with thickness is expected for larger values of length.

Figure 4:
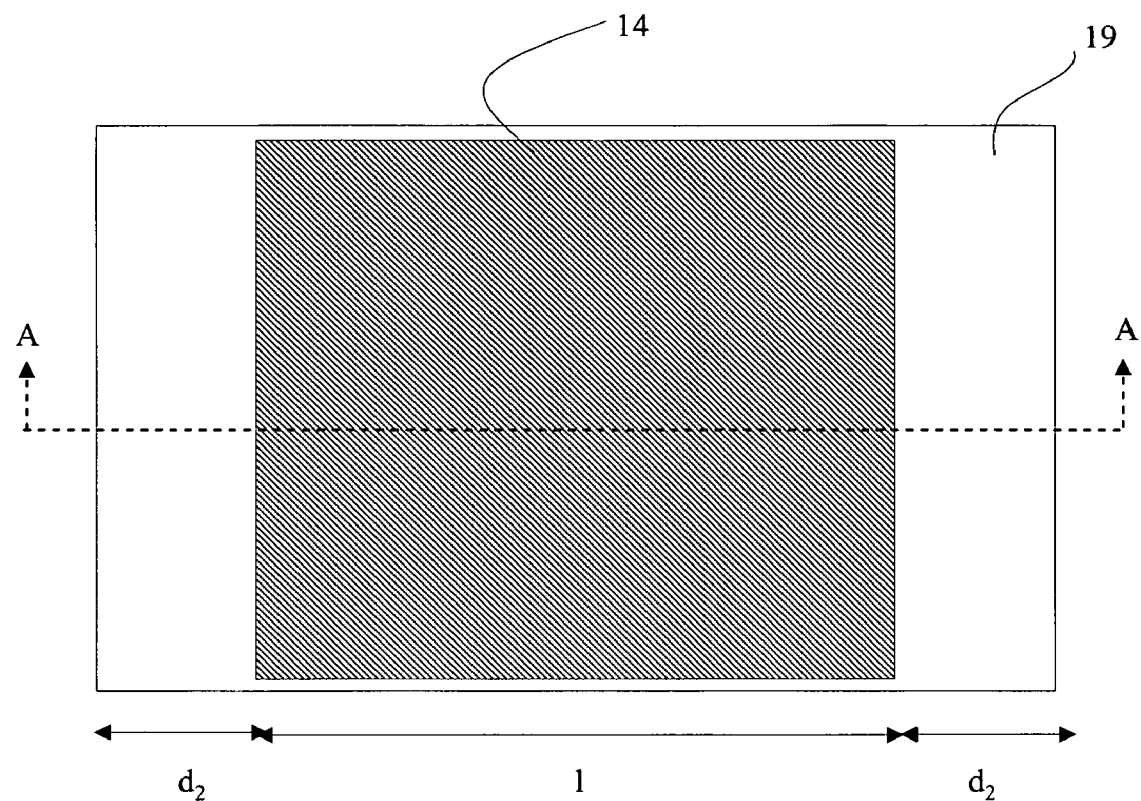
FIG. 4 is a top plan schematic view of the intermediate plate mounted on the upper carrier plate of a TEC taken along the AA section of FIG. 3.

The surface region of the TEC thermally stabilised surface 19 free from the intermediate plate is not in direct thermal contact with the optical bench, as air or other gases fills the gap (of thickness g) between the free surface region of the TEC upper carrier plate and the optical bench. In FIG. 3, the distance along the X-axis between the right edge of the intermediate plate 14 and the right edge of the TEC upper carrier plate 13 is denoted with $d_2$. In the illustrated embodiment, the intermediate plate is centrally positioned on the TEC upper plate and therefore an equal distance, $d_2$, exists from the left edge of the upper carrier plate to the left edge of the intermediate plate. FIG. 4 shows a top plan view of the laser module of FIG. 3 along the AA section.

Within the gap between the TEC thermalised surface and the bottom surface of the optical bench thermal exchange can still occur due to convection, because also of the relatively small thickness of the intermediate plate. Therefore, the temperature of the lower surface region of the optical bench corresponding to the gap is closer to the temperature of the thermally stabilised TEC surface than the surface region of the optical bench extending outside the TEC surface, thereby ensuring a certain degree of thermal stability. In other words, the thermal resistance of a relatively thin layer of non-conductive material, such as air, is considerably larger than the thermal resistance across thermally conductive materials (i.e., considering the typical thicknesses of the materials in laser assemblies and that thermal conductivity of air is very low, i.e., 0.027 W/mK), but the relatively small size, g, (preferably not larger than about 0.5 mm) of the gap provides for a certain degree of thermalisation in the regions of the optical bench positioned above the TEC carrier plate.

Table I reports numerical results of the computer simulations for the external-cavity laser module described with reference to FIGS. 3 and 4. Results are obtained for a thickness, t, of the intermediate plate of 0.125 mm, $d_3$=0.58 mm and $\Delta T$=45° C. With reference to FIG. 3, the value $d_3$ is the distance between the right edge of the TEC upper carrier plate 13 and the right edge of the optical bench 11.

TABLE I

| l (mm) | l/a | $\Delta T$ at the left edge of the optical bench (° C.) | $\Delta T$ at the laser chip (° C.) | $\Delta T$ at the right edge of the optical bench (° C.) | Optical bench deformation (%) |
|---|---|---|---|---|---|
| 5 | 0.41 | 2.44 | 2.49 | 0.20 | −87 |
| 7 | 0.57 | 1.93 | 1.98 | 0.13 | −64 |
| 8.5 | 0.70 | 1.56 | 1.61 | 0.09 | −45 |
| 10 | 0.82 | 1.19 | 1.23 | 0.06 | −28 |

The second column reports the ratio between the length, l, of the intermediate plate and the length, a, of the thermally stabilised surface of the TEC along the same longitudinal direction (the X-axis). The value of a is assumed to be 12.2 mm. For $\Delta T$>0, mechanical deformations lead to a reduction of the physical length of the laser cavity, which corresponds to a reduction of optical path length. The last column of Table I reports the reduction of the effect of the mechanical deformation (i.e., the reduction of the contraction of the laser cavity length) with respect to the case under the same conditions, but without intermediate plate. For instance, from Table I, if the optical path length is reduced by 2.3 µm due to mechanical deformations of the TEC carrier plate (no intermediate plate), the presence of an intermediate plate of 10 mm reduces the variation of the optical path length of 28%, i.e., the laser cavity length is reduced by mechanical deformations by 1.65 µm. In Table I, a value of 0 in the last column would mean that all mechanical deformations of the TEC upper carrier plate are transferred to the optical bench.

Results show that to an increase of the length of the intermediate plate relative to that of the TEC thermalised surface there corresponds an increase of mechanical deformations. Given a TEC thermalised surface with a certain size along a main longitudinal direction, a suitable size of the intermediate plate along said direction should preferably result both in a significant decrease of mechanical deformation of the optical bench and in an efficient thermalisation of the laser cavity within the operative temperature range, varying typically from −5° C. to 70° C.

Since mechanical deformations are more pronounced at the edges of the upper carrier plate, mechanical contact between optical bench and the TEC should be avoided in correspondence of the edge regions TEC upper carrier plate. According to the present invention, the mechanical contact between the optical bench and the TEC thermalised surface takes place only through the intermediate plate. Within this context, mechanical contact between two elements means that horizontal (e.g., along the X axis) and generally also vertical deformations are at least partially transferred from one element to the other.

Preferably, the ratio between the length of the intermediate plate and the length of the thermally stabilised surface of the TEC along a main longitudinal direction ranges from about 0.50 to about 0.65, more preferably from 0.55 to 0.60.

Selection of a suitable thickness of the intermediate plate depends also on the thermal conductivity of the material making the intermediate plate. Preferably, the thickness of the intermediate plate, t, is not larger than 0.5 mm, more preferably is not larger than 0.4 mm and most preferably not larger than 0.3 mm.

Regarding the preferred minimum value for the thickness of the intermediate plate, it is to be noted that very thin intermediate plates, compared to the thickness of the optical bench, may not efficiently dampen the mechanical deformations, unless a material having a very high Young modulus is selected, which however would increase the fabrication costs.

Figure 5:
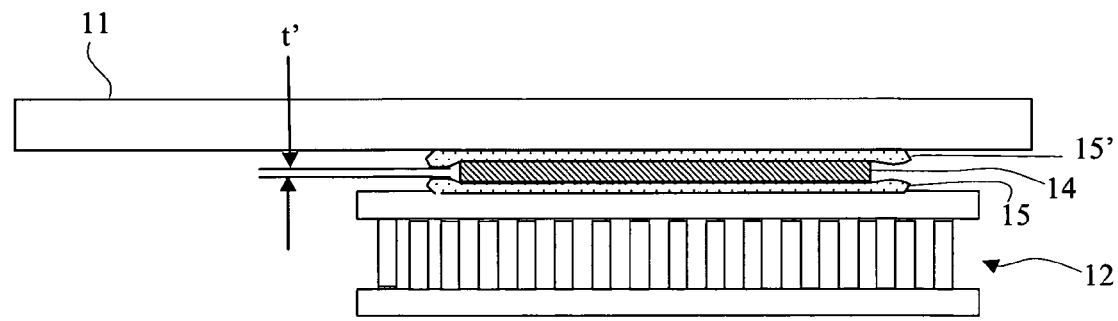
FIG. 5 is a schematic lateral view of an optical bench mounted on a TEC according to an embodiment of the present invention.

Furthermore, if the intermediate plate is attached to the upper carrier plate and to the optical bench by soldering, the thickness of the soldering material is to be considered. FIG. 5a is a schematic view (not to scale) of an optical bench mounted on a TEC according to an embodiment of the invention. The same reference numerals are given to elements of the laser module corresponding to those shown in FIG. 3 and their description is omitted. For clarity, the elements of the laser cavity are not shown. The intermediate plate 14 is soldered to the thermally stabilised surface of the TEC 12 and to the bottom surface of the optical bench 11 by means of two solder layers 15, 15'.

For example, a first 50 µm solder preform 15 made of SnPb is adhered to the thermally stabilised surface of the TEC. Then, a 125 µm-thick intermediate plate 14 is placed on the first solder preform, a second 50 µm solder preform 15' made of SnPb is positioned on the intermediate plate. The optical bench 11 is then adhered to the second solder perform 15' and the assembly is heated, e.g., at a maximum temperature of 210° C., at which it is kept for 1-2 minutes in order to complete the soldering process. Since the carrier plates of a TEC are generally made of a ceramic material, a region of the thermally stabilised surface underneath the first solder preform may need to be metallised. Similarly, a region of the bottom surface of the optical bench in physical contact with the second solder preform can be metallised.

The Applicant has observed that, if the thickness of the intermediate plate is of about the same order of magnitude as the thickness of the solder layers, e.g., the intermediate plate is 70 µm thick and is sandwiched between two solder layers of 50 µm each, the intermediate plate can be submerged within the solder layers after the thermal treatment of the soldering process. In other words, the distance, t', between the two solder layers 15 and 15' in a direction perpendicular to the thermally stabilised surface can become close to zero, after completion of the soldering process. This situation should be avoided because it may lead to a spreading of solder along the main longitudinal direction of the TEC upper carrier plate in regions outside the intermediate plate so that the thermally stabilised surface and the optical bench result bonded one another to a relatively large and non controlled extent along the main longitudinal direction. Mechanical deformations are then transferred to the optical bench and the beneficial effect due to the presence of the intermediate plate is reduced. A suitable thickness of the intermediate plate should therefore be selected also in dependence of the thickness of the solder layers used to attach the plate. The thickness of the intermediate plate is preferably larger by a factor greater than two with respect to the sum of the thickness of the solder layers.

Preferably, the intermediate plate has a thickness of not less than 50 µm.

Preferably, the intermediate plate is made of a material having a thermal conductivity larger than about 120 W/mK, more preferably larger than 160 W/mK. Preferably, the intermediate plate has a coefficient of thermal expansion (CTE) of the same order as that of the TEC upper carrier plate, i.e., the ratio between the larger CTE and the smaller CTE of the two plates is not larger than a factor of about 1.5. More preferably, the CTE of the optical bench is of the same order as that of the intermediate plate. According to a preferred embodiment, the TEC upper carrier plate, the optical bench and the intermediate plate are made of a material with about the same CTE, for instance they are made of AlN(CTE=4-4.5 ppm/° C.).

Figure 6:
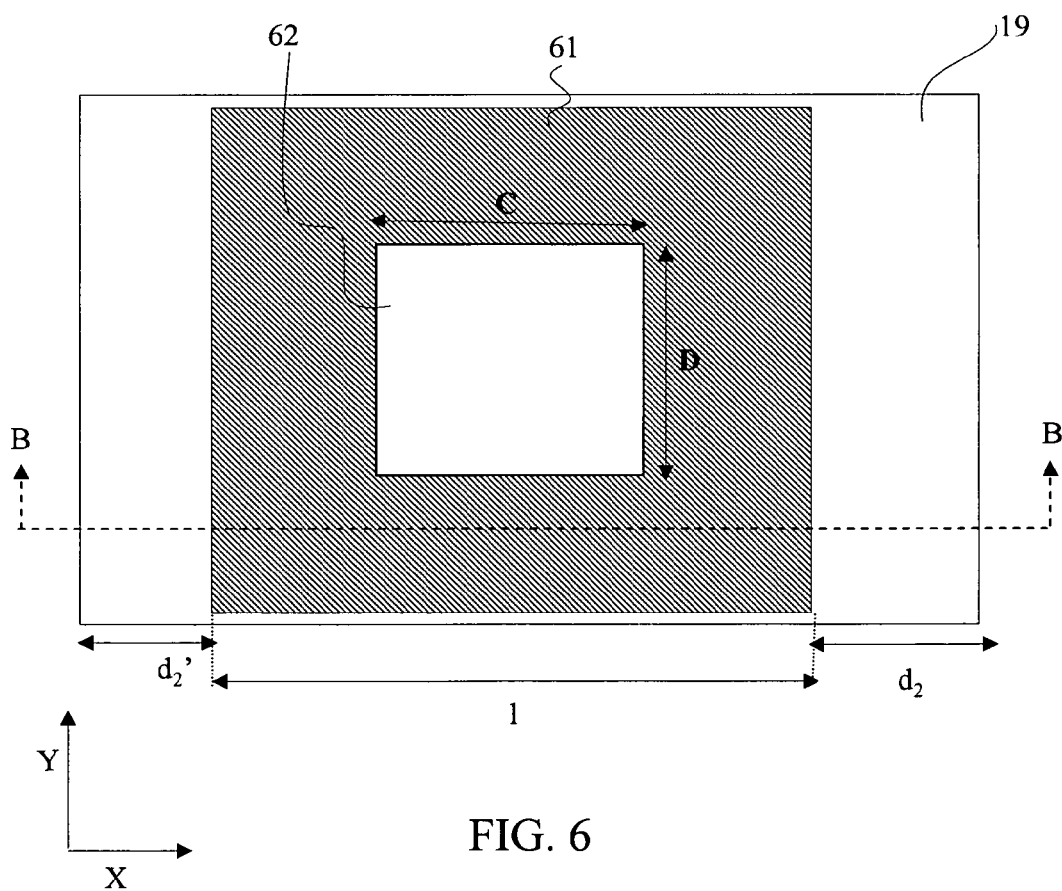
FIG. 6 is a top plan schematic view of the intermediate plate mounted on the upper carrier plate of a TEC according to another embodiment of the present invention.

FIG. 6 is a top plan schematic view of the intermediate plate mounted on the upper carrier plate of a TEC according to another embodiment of the present invention. An intermediate plate 61 is placed, e.g., soldered, on the thermally stabilised surface 13 of the TEC carrier plate. The intermediate plate 61 has a central aperture 62 of dimensions C×D.

In the embodiment illustrated in FIG. 6, the distance from the left edge of the thermalised surface to the left edge of the intermediate plate 61, $d_2'$, is different from the distance, $d_2$, from the right edge of the intermediate plate to the right edge of the thermalised surface 19.

Figure 7A:
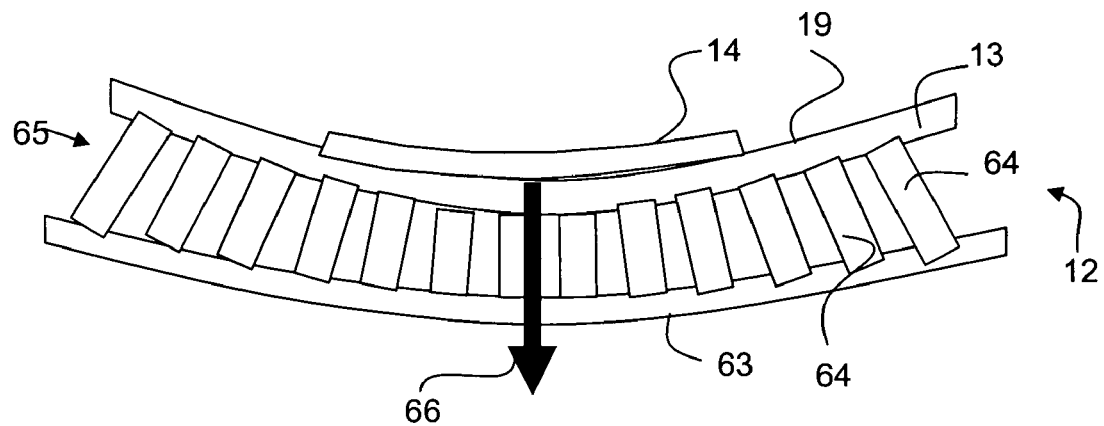
FIG. 7a is a schematic partial lateral view (only the intermediate plate and the TEC are shown) illustrating the mechanical deformations under a temperature gradient of the structure of FIG. 3.

FIG. 7a is a partial lateral views of FIG. 3 wherein only the intermediate plate 14 and the TEC 12 are shown and it schematically depicts mechanical deformations of the upper carrier plate 13 under a positive temperature gradient, $\Delta T$. The expansion difference between the upper carrier plate 13 and the lower carrier plate 63 is accommodated by a slight rotation of the semiconductor columns 64 forming the Peltier cell 65. Since the intermediate plate 14 of FIG. 7a has a full-frame structure and it is attached on the thermally stabilised surface 19, warp of the upper carrier plate tends to press down the intermediate plate along the direction indicated by arrow 66.

Figure 7B:
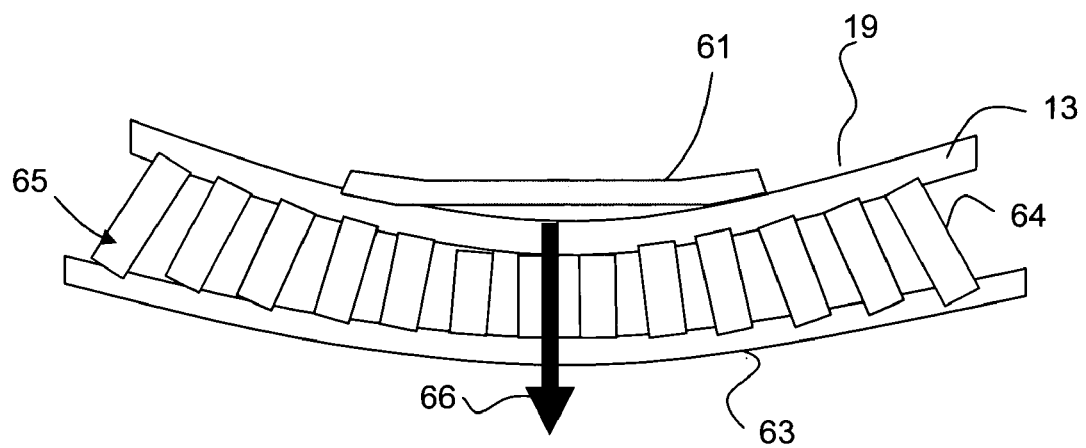
FIG. 7b is a schematic lateral view illustrating the mechanical deformations under a temperature gradient of the structure of FIG. 6 taken along BB section line.

Computer simulations show that deformation isosurfaces on the thermally stabilised surface are concentric about the centre of the TEC upper surface. With reference to FIG. 7b, which is a schematic lateral view of FIG. 6 along BB section line, a central aperture makes the intermediate plate 61 unengaged from the underlying TEC surface 19 so that the region corresponding to the central aperture does not undergo to the same mechanical deformation as the TEC surface. Mechanical deformations are then efficiently dampened down. For example, the intermediate plate mounted on a thermalised surface of 12×6 mm can have a size of 7×6 mm², an aperture C×D of 2×1.5 mm² o 2×1 mm².

However, it is to be noted that an intermediate plate with a central aperture has a smaller thermal efficiency than an intermediate plate as that shown in FIG. 4, since, in correspondence to the aperture, there is no direct thermal contact between the thermally stabilised surface of the TEC and the optical bench. According to a preferred embodiment, the central aperture has a length along the X axis (C) which is less than about 30% of the length of the intermediate plate, 1, along the same axis.

According to a preferred embodiment, the gain medium is placed on a thermally conductive platform having a length larger than the length of the TEC thermally stabilised surface along the longitudinal direction of the optical axis of the laser beam within the cavity. Preferably, the gain medium is placed at a certain distance, $d_4$, along said longitudinal direction, from the thermally stabilised surface of the TEC.

When the environmental temperature ($T_{env}$) is consistently larger than the temperature ($T_1$) at which the upper TEC surface is stabilised, i.e., $\Delta T=(T_{env}-T_1)>>0$, a laser chip positioned at a certain distance along the longitudinal direction from the thermally stabilised surface is at a temperature somewhat closer to the environmental temperature than the temperature it would have had if it was mounted directly above the TEC surface, i.e., at zero distance along said longitudinal direction. In other words, if $T_{env}>>T_1$ (e.g., $\Delta T>+20°$ C.), the gain medium is at a temperature, $T_2$, closer to the environmental temperature than the temperature $T_1$. The temperature difference between the gain chip and the environmental temperature, $\Delta T'=(T_{env}-T_2)$, is often not smaller than zero, but it is smaller than $\Delta T$. A situation where $\Delta T'=0$ may take place and it corresponds to the case where $T_2$ is accidentally equal to $T_{env}$, such a situation can occur generally when $T_{env}$ is larger than $T_1$ of not more than about 10° C.

Conversely, if $T_{env}<T_1$, the gain chip is at a temperature, $T_2 \geqq T_1$ so that the temperature gradient between the gain chip and the stabilised temperature, $\Delta T$, is generally either zero or of opposite sign to the temperature gradient between $T_1$ and $T_{env}$.

Both for $T_{env}>T_1$ and for $T_{env}<T_1$, when $|\Delta T'|<|\Delta T|$, a variation of the optical path length is induced in the direction opposite to the variation of the optical path length caused by mechanical deformations. This leads to a partial compensation of the variation of the optical path length caused by mechanical deformations.

Figure 8:
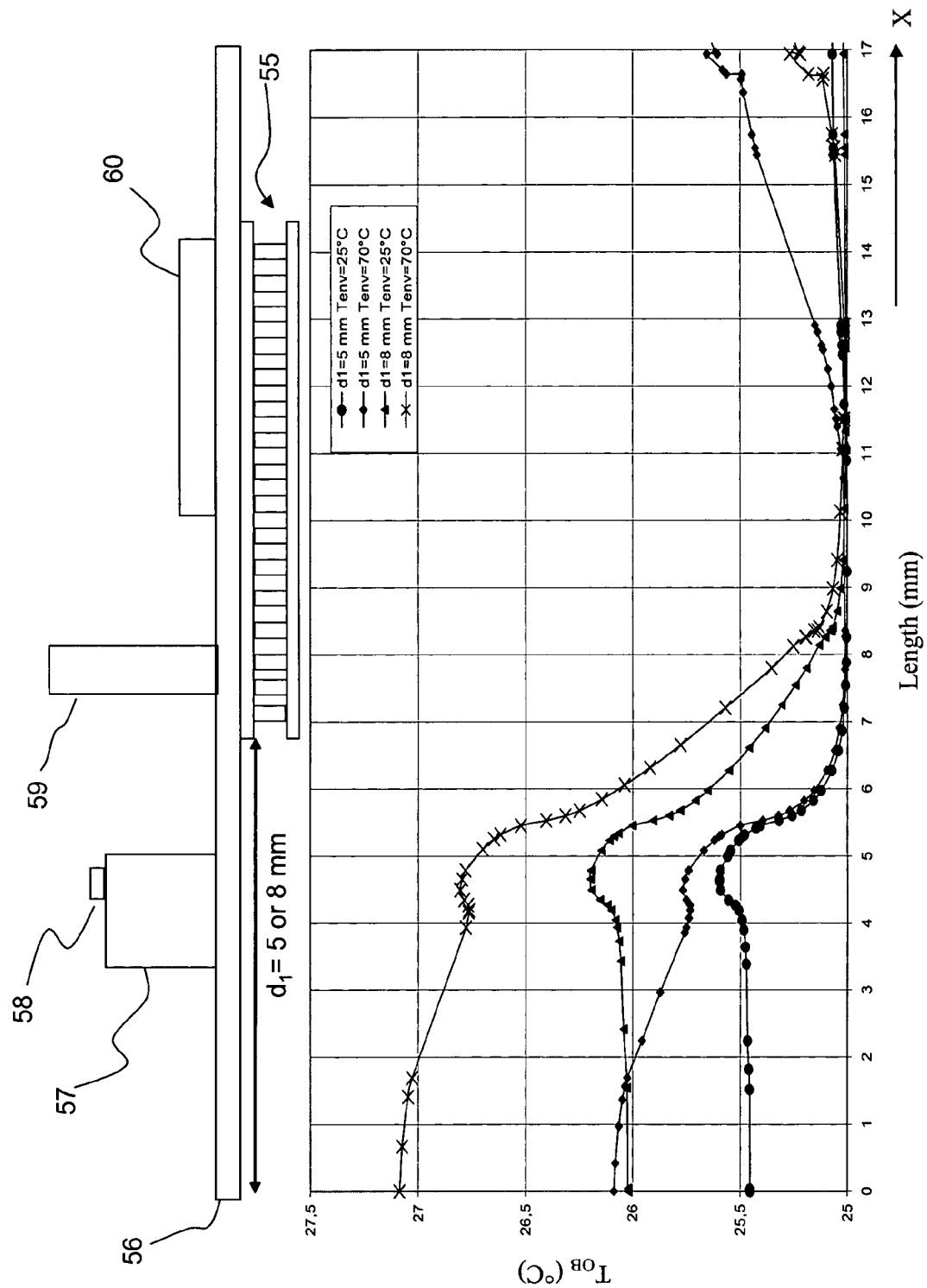
FIG. 8 shows computer simulations of the temperature as a function of the position along the length of an optical bench mounting an external cavity along the main longitudinal direction of the optical bench, which is substantially parallel to the main optical axis of the optical beam within the cavity.

In order to illustrate the dependence of temperature difference on the position of the laser chip with respect to the thermalised TEC surface, FIG. 8 shows computer simulations of the temperature curves ($T_{OB}$, i.e., the temperature measured on the optical bench upper surface) vs. position along the length of the optical bench mounting a laser assembly. No intermediate plate was considered in the calculations. Optical bench 56 is placed on a TEC 55 with surface area of the thermally stabilised surface of 8×8 mm² (i.e., the TEC upper carrier plate is a square-shaped plate) said surface being stabilised at a temperature $T_1=25°$ C. Simulations were carried out at two different environmental temperatures, $T_{env}=25°$ C. (i.e., equal to the temperature at which the TEC is set) and $T_{env}=70°$ C. The optical bench is a rectangular-shaped plate of length of 17.5 mm (along the X-axis) and width of 7.2 mm. The optical bench 56 is placed on the TEC upper plate at two different positions along the longitudinal main direction of the optical bench (i.e., X axis), which correspond to two different distances, $d_1$, along the X direction, between the left edge of the optical bench and the left edge of the TEC upper carrier plate. The optical axis of the laser cavity is substantially parallel to the X direction. The two distances $d_1$, which are 5 and 8 mm, in turn correspond to two different distances, $d_4$, of about 1 mm and 4 mm, respectively, of the gain chip from the upper plate of the TEC. The optical bench 56 is assumed to have a thermal conductivity of about 180 W/mK, while the submount 57 is assumed to have a thermal conductivity of 160-190 W/mK. In simulations, the laser cavity included a mirror 60, which is placed on a surface region of the optical bench at a zero longitudinal distance (i.e., along the X-axis) from the thermally stabilised surface of the TEC 55.

A slight increase (within about 1° C.) of the temperature in correspondence to the gain chip can be seen also for $T_{env}=T_1$ (solid triangles and solid circles in FIG. 8), due to self-heating of the gain chip during operation and to the fact that the gain chip is positioned at $d_1$ from the TEC thermally stabilised surface. It is clear from FIG. 8 that to larger distances $d_4$ there correspond larger temperature gradients on the gain chip. For $T_{env}=70°$ C. ($\Delta T=45°$ C.) and $d_4=4$ mm, $\Delta T \approx 1.7°$ C. If the distance $d_4$ is smaller than about 2 mm ($d_4$–0—not shown in the figure—corresponds to the case the gain chip is placed above the TEC upper carrier plate at zero distance X direction), the gain chip undergoes relatively small temperature variations with $T_{env}$ for $\Delta T>>0$ (i.e., a small reduction of $\Delta T'=(T_{env}-T_2)$ is obtained), which can be not sufficient to significantly compensate the variations of optical path length due to mechanical deformations of the TEC.

Applicant has observed that also in case of a gain chip placed at a relatively large distance from the closest side edge of the TEC upper plate, e.g., $d_4=4$ mm, the temperature gradient can be not sufficient to bring a beneficial contribution to the reduction of the optical path length variation. Larger longitudinal distances from the edge of the TEC are often not feasible in designs of commercial external-cavity lasers, such as in case of transmitters for WDM/DWDM systems (reference is made also to Eq. (1)) and/or because of package constraints.

Although positioning the gain chip at a certain distance from the TEC upper surface may not lead to the necessary reduction of the optical path length variation, a particularly advantageous configuration of laser module includes an intermediate plate according to the present invention and a gain chip positioned at a certain distance from the thermally stabilised surface. This is because the presence of the intermediate plate may not be enough to fully or sufficiently compensate for the variation of the optical path length of the laser cavity.

Preferably, the distance, $d_4$, is not smaller than 2 mm, more preferably it is comprised between 3 and 5 mm.

Preferably, the thermal resistance of the heat flow path from the gain medium to the thermally stabilised surface of the TEC, $R_{OB}$, is smaller than about 10 K/W. Preferably, the thermal resistance of the heat flow path from the gain medium to the thermally stabilised surface of the TEC is not smaller than about 5 K/W.

According to the a preferred embodiment of the present invention, the external-cavity laser is a tuneable laser including a gain medium emitting a light beam, a grid generator and a channel selector, both grid generator and channel selector being located along the optical path of the beam exiting the gain medium. The grid generator selects periodic longitudinal modes of the cavity at intervals corresponding to the channel spacing and rejects neighbouring modes. The channel selector selects a channel within the wavelength grid and rejects other channels.

Preferably, the channel selector is a tuneable mirror, which forms an end mirror of the external cavity and defines it in length together with the reflecting front facet of the gain medium, e.g., a semiconductor laser diode. In other words, the tuneable mirror functions both as channel selector and as end mirror for the laser cavity.

The grid generator is preferably a Fabry-Perot (FP) etalon, which is structured and configured to define a plurality of equally spaced transmission peaks. In applications for WDM or DWDM telecommunication systems, transmission peak spacing, i.e., the free spectral range (FSR) of the grid element, corresponds to the ITU channel grid, e.g., 50 or 25 GHz.

When present in the laser cavity together with the grid generator, the tuneable mirror serves as the coarse tuning element that discriminates between the peaks of the grid generator. For single-mode laser emission, a longitudinal cavity mode should be positioned over the maximum of one of the grid transmission peaks (the one selected by the tuneable mirror). In this way, only the specified frequency will pass through the grid and the other competing neighbouring cavity modes will be suppressed. Wavelength selectivity of the tuneable mirror is preferably achieved by an electrical signal. The tuneable mirror of the present invention preferably comprises an electro-optically tuneable material, more preferably a liquid crystal (LC) material. In case of a LC-based tuneable mirror, the applied voltage is an ac voltage.

Laser assemblies are typically housed in a package that protects the laser components and other electronic or thermoelectric components associated to the laser assembly from the external environment. External cavity lasers for telecommunications are generally housed in hermetically sealed packages so as to allow the laser assembly to be sealed within an inert atmosphere to prevent contamination/degradation of the optical surfaces of the various components of the laser.

Figure 9:
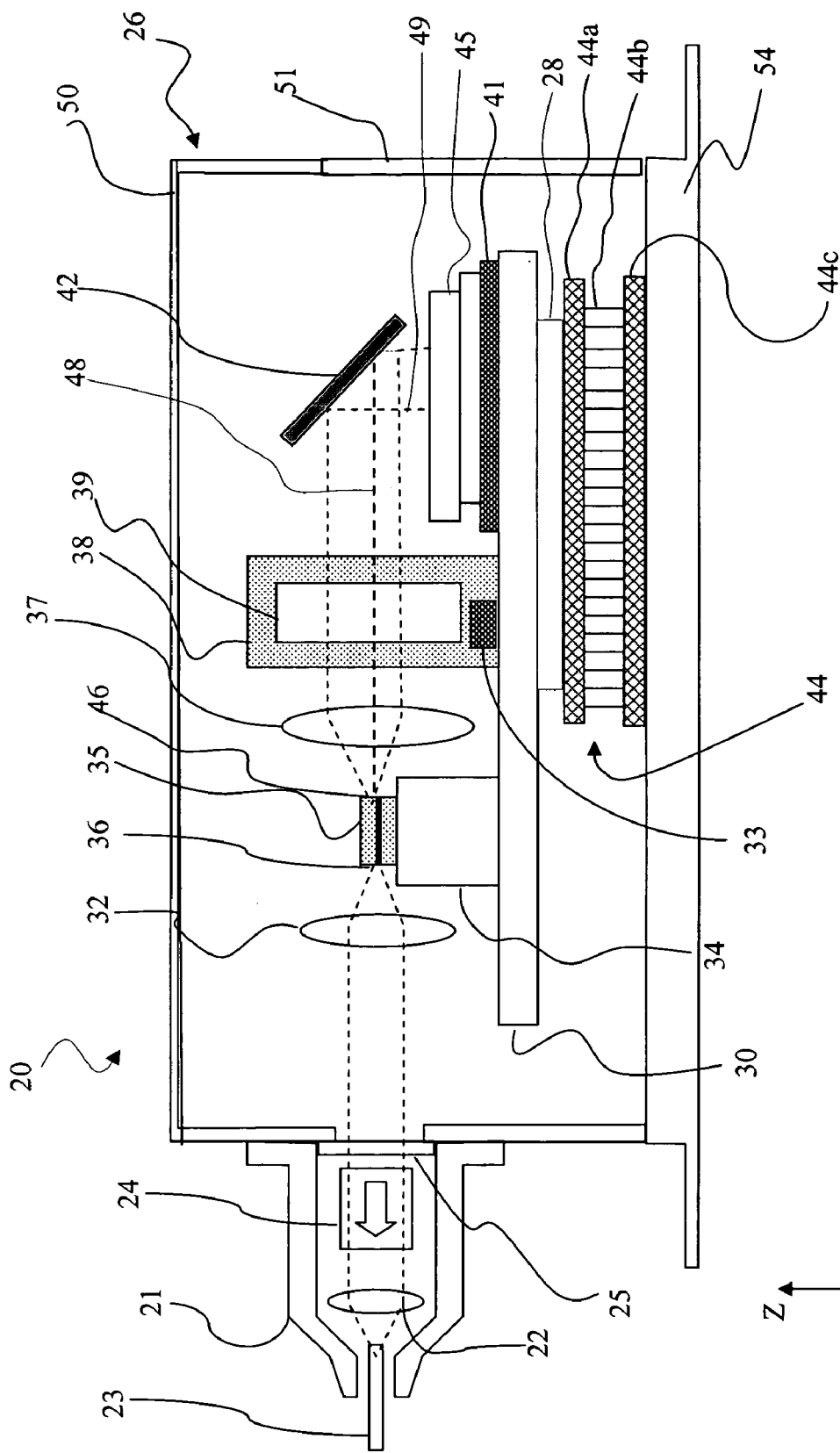
FIG. 9 is a lateral view of a laser module according to a preferred embodiment of the present invention.

A tuneable laser module according to a preferred embodiment of the present invention is schematically depicted as a side view in FIG. 9. The laser module 20 comprises an external cavity laser assembly housed in a package 26, e.g., a 14-pin butterfly package, which defines an enclosure 51 including four lateral walls (only two walls are shown in FIG. 9). The package 26 comprises a base 54 and a lid 50. The lid seals hermetically the enclosure. The package includes a boot 21 for the insertion of an optical fibre, i.e., fibre pigtail 23. A glass window 25 closes up hermetically the laser assembly from the boot for fibre insertion. The laser assembly includes a gain medium 35, a collimating lens 37, a grid generator 39, a deflector 42 and a tuneable mirror 45. The gain medium 35 is based on a semiconductor laser chip, for example an InGaAs/InP multiple quantum well Fabry-Perot (FP) gain chip especially designed for external-cavity laser applications. The diode comprises a back facet 36 and a front facet 46. The diode's front facet 46 is an intracavity facet and has an anti-reflection coating. Preferably, the gain chip waveguide is bent so that it has an angled incidence on the front facet in order to further reduce back reflections. The back facet 36 is partially reflective and serves as one of the end mirrors of the external cavity. The reflectivity of the back facet can range for instance between 10% and 30% in order to allow a relatively high laser output power.

Within the laser cavity, the emerging beam from the laser chip front facet 46 is collimated by collimating lens 37 that collimates the beam to define an optical path 47. The collimated beam impinges onto grid generator 39.

The laser assembly is placed on a thermally conductive platform 30, i.e., the optical bench, which functions also as mechanical reference base for the optical elements. The use of a common optical bench is preferred because it minimises the design complexity and simplifies the alignment between the components of the tuneable laser. The platform 30 is made of any thermally conductive material, such as aluminium nitride (AlN), silicon carbide (SiC) and copper-tungsten (CuW).

A TEC 44 including an upper carrier plate 44a, a Peltier cell 44b and a lower carrier plate 44c provides the thermal control for the thermally conductive platform 30 by stabilising the temperature of the upper carrier plate 44a. A thermally conductive intermediate plate 28 is placed on the upper carrier plate 44a, e.g. it is glued or soldered on the thermally stabilised surface, namely the upper surface of the upper carrier plate 44a. The optical bench 30 is placed on the intermediate plate 28, for instance, it can be glued or soldered to the intermediate plate 28 so as to minimise the thermal resistance between the surface where the optical components are mounted and the upper surface of the intermediate plate. Therefore, the optical bench 30 is in thermal coupling with TEC 44 through intermediate plate 28.

The lower carrier plate 44c is secured on the base 54 of the package. Temperature monitoring of the thermally conductive platform is provided by a thermal sensor device 33, such as a thermistor or a thermocouple, which is placed on the platform and is operatively coupled to the TEC so as to provide control signals to cool or heat the surface of the TEC in thermal contact with the platform 30, and thus to heat or cool platform 30 in order to maintain an approximately constant temperature, $T_1$. In the embodiment of FIG. 8, the thermal sensor device is placed in proximity of the FP etalon 39, for control of its thermal stability. The lower carrier plate 44c of the TEC 44 is placed at about the environmental temperature, $T_{env}$, on the internal surface (i.e., internal with respect to the enclosure) of base 54.

The gain chip 35 is preferably placed, e.g., by bonding, on a thermally conductive submount 34 so as to position the emitted beam at a convenient height with respect to the other optical elements and to further improve heat dissipation. The thermally conductive sub-mount 34, made for instance of SiC, is placed on the thermally conductive platform 30.

The length of the platform 30 substantially along the main longitudinal direction X is substantially parallel to the main optical axis of the optical beam within the laser cavity and it is larger than the length of upper carrier plate 44a (always along the X direction). The gain chip 35 is placed at a certain longitudinal distance, along the X-axis, from the edge of the upper plate of the TEC. The position of the gain chip is selected so that a temperature difference, $\Delta T'$, not larger than 5° C. is created between the gain chip temperature and $T_{env}$ for an environmental temperature largely different (e.g., more than 10-15° C. and typically not larger than 45-50° C.) from the stabilised temperature, $T_1$. Preferably, $\Delta T'$ is comprised between 2° C. and 5° C., depending also on the magnitude of the mechanical deformations to be compensated.

The grid generator 39 is preferably a FP etalon. The laser can be designed in such a way that the operating wavelengths are aligned with the ITU channel grid. In this case, the laser wavelength is centred to the ITU grid via the FP etalon 39, which is structured and configured to define a plurality of equally spaced transmission peaks. In applications for WDM or DWDM telecommunication systems, transmission peak spacing, i.e., the FSR of the grid element, corresponds to the ITU channel grid, e.g., 50 or 25 GHz. In order to stabilise its temperature, the FP etalon 39 is preferably housed in a thermally conductive housing 38 to promote thermal contact with the platform 30.

After the FP etalon 39, the laser beam strikes a deflector 42 that deflects the beam 47 onto a tuneable mirror 45 along optical path 49. The tuneable mirror 45 reflects the light signal back to the deflector 42, which in turn deflects the light signal 48 back to the gain medium 35. The deflector 42 is in this embodiment a planar mirror, for instance a gold-coated silicon slab.

Although not shown in FIG. 9, the deflector can be secured in the cavity for instance by means of a support structure that is fixed to the platform 30. The deflector can be glued to the support structure or, if it is at least partly metallised, soldered.

Preferably, the deflector is aligned to the laser beam by means of active optical alignment techniques.

The tuneable mirror 42 is an electro-optic element, in which tuneability is achieved by using a material with voltage-dependent refractive index, preferably a liquid crystal (LC) material. For example, a tuneable mirror is that described in WO patent application No. 2005/064365. The tuneable mirror serves as the coarse tuning element that discriminates between the peaks of the FP etalon. The FWHM bandwidth of the tuneable element is not smaller than the FWHM bandwidth of the grid etalon. For longitudinal single-mode operation, the transmission peak of the FP etalon corresponding to a particular channel frequency should select, i.e., transmit, a single cavity mode. Therefore, the FP etalon should have a finesse, which is defined as the FSR divided by the FWHM, which suppresses the neighbouring modes of the cavity between each channel. For single-mode laser emission, a longitudinal cavity mode should be positioned over the maximum of one of the etalon transmission peaks (the one selected by the tuneable element). In this way, only the specified frequency will pass through the etalon and the other competing neighbouring cavity modes will be suppressed.

According to the present embodiment, the external laser cavity is a folded resonant cavity having an optical path length, which is the sum of the optical path 48 between the back facet 35 of the gain medium and the deflector 42 and the optical path 49 between the deflector and the tuneable mirror 45.

The laser beam is coupled out of the external cavity by the partially reflective back facet 36 of the laser diode 35. Preferably, a collimating lens 32 can be placed along the optical path of the laser output beam. A fibre focus lens 22 directs the light, which has passed through an optical isolator 24, into fibre pigtail 23. Optical isolator 24 is employed to prevent back-reflected light being passed back into the external laser cavity and is generally an optional element.

In the preferred embodiments, the laser assembly is designed to produce substantially single longitudinal and, preferably, single-transversal mode radiation. Longitudinal modes refer to the simultaneous lasing at several discrete frequencies within the laser cavity. Transversal modes correspond to the spatial variation in the beam intensity cross section in the transverse direction of the lasing radiation. Generally, an appropriate choice of the gain medium, e.g., a commercially available semiconductor laser diode including a waveguide, guarantees single spatial, or single transversal, mode operation. The laser is operative to emit a single longitudinal mode output, which depends on the spectral response of the optical elements within the cavity and on the phase of the cavity.

Although not shown in FIG. 8, lenses 32 and 37 are mounted to the platform by individual mounts.

The FP etalon 39 and the tuneable mirror 45 are mounted on the surface region of the optical bench 30 placed above the upper carrier plate 44a of the TEC 44 in order to minimise the thermal resistance of the heat flow path. The thermal resistance of the heat flow path between the tuneable mirror and the TEC surface is preferably smaller than the thermal resistance, $R_{OB}$, between the gain chip and the TEC surface. The thermal resistance between the tuneable mirror and the TEC thermally stabilised surface is preferably not larger than 2 K/W, more preferably not larger than 1 K/W.

The tuneable mirror 45 lays substantially horizontally with respect to the principal surface plane of the thermally conductive platform 30. In a preferred embodiment, the tuneable mirror is placed onto a thermally conductive substrate or in a holder (indicated with 41 in FIG. 8) that can house the tuneable mirror. In case the platform 30 is made of a metallic material, the substrate or holder 41 should be made of an electrically insulating material (with high thermal conductivity) in order to avoid an electrical contact between the tuneable mirror and the platform, as the tuneable mirror is normally biased during laser operation. In a preferred embodiment, the holder 41 is made of AlN or SiC.

By laying the tuneable mirror horizontally on the platform, the thermal contact with the platform is maximised while there is no need of actively aligning the mirror with respect to the laser beam during laser assembly. Preferably, during laser assembly, the tuneable mirror is bonded onto the thermally conductive platform by means of a thermally conductive epoxy, for instance Ag-filled epoxy, or of silicone resin. Alternatively, the tuneable mirror is housed in a holder or placed on a substrate that is bonded to the thermally conductive platform. The mirror can be glued to the substrate or holder. What needs to be aligned to the laser beam, preferably by optical active alignment techniques, is the deflector 42.

For a laser configuration having the tuneable mirror "horizontal" with respect to the optical bench, maximum temperature variations of the tuneable mirror remain lower than 0.1° C. across the temperature operating range from −10 to 70° C., even when the dissipated power of the tuneable mirror, which is due to the applied voltage, is as high as 50 mW.

It is however to be understood that the present invention envisage as alternative preferred embodiment also an external cavity laser assembly, wherein the tuneable mirror is positioned substantially perpendicularly to the optical beam (as schematically shown in FIG. 3).

The invention claimed is:

1. An external-cavity laser module comprising a thermoelectric cooler comprising an upper carrier plate including an upper surface and being configured to stabilise the temperature of said upper surface, wherein said upper surface has a first length along a main longitudinal direction; a thermally conductive platform in thermal coupling with the upper surface of the thermoelectric cooler and having a second length along said main longitudinal direction; a laser assembly comprising a gain medium for emitting an optical beam into the external cavity, said gain medium being placed in thermal contact with said thermally conductive platform; a thermally conductive intermediate plate arranged between said upper carrier plate and said thermally conductive platform, said intermediate plate being in thermal coupling with both the upper carrier plate and the thermally conductive platform and having a third length along said main longitudinal direction, wherein said third length is smaller than said first length and wherein a mechanical contact between the thermally conductive platform and the upper surface takes place only through said intermediate plate and wherein the ratio between said third length of said intermediate plate and said first length of said upper surface is comprised between 0.5 and 0.65.

2. The laser module of claim 1, wherein the ratio between said third length of said intermediate plate and said first length of said upper surface is comprised between 0.55 and 0.60.

3. The laser module of claim 1, wherein said intermediate plate has a thickness not larger than 0.5 mm.

4. The laser module of claim 2, wherein said intermediate plate has a thickness comprised between 0.05 and 0.4 mm 5. The laser module of claim 1, wherein said upper surface of said upper carrier plate has a left edge and a right edge along said main longitudinal direction and said intermediate plate is placed on said upper surface at a first distance from the left edge and at a second distance from the right edge, said intermediate plate being placed on said upper surface so as said first distance and said second distance are substantially equal.

6. The laser module of claim 5, wherein said first distance and said second distance are of at least 2 mm.

7. The laser module of claim 1, wherein said second length of the thermally conductive platform is larger than said first length and said upper surface of said upper carrier plate has a left edge and a right edge along said main longitudinal direction and said gain medium is placed on said thermally conductive platform at a third distance along said longitudinal direction from said left edge, said third distance being not smaller than 2 mm.

8. The laser module of claim 7, wherein said third distance is comprised between 3 and 5 mm.

9. The laser module of claim 1, wherein said intermediate plate comprises a central aperture having a fourth length along said main longitudinal direction, the ratio between said fourth length and the third length of the intermediate plate is of less than about 0.30.

10. The laser module of claim 1, further comprising a thermally conductive submount onto which said gain medium is placed, said submount being placed on said thermally conductive platform.

11. The laser module of claim 1, wherein said laser assembly is configured to emit output radiation and said external cavity defines a plurality of cavity modes, said laser module further comprising a grid generator being arranged in the external cavity to define a plurality of pass bands substantially aligned with corresponding channels of a selected wavelength grid, and a tuneable element being arranged in the external cavity to tuneably select one of said pass bands so as to select a channel to which to tune the optical beam.

12. The laser module of claim 11, wherein said tuneable element is a tuneable mirror functioning also as end mirror of the external cavity and the grid generator is arranged in the laser cavity in the optical path of the laser beam emitted by the gain medium between the gain medium and tuneable mirror, the grid generator being a Fabry-Perot etalon.

13. The laser module of claim 11, wherein said grid generator and said tuneable element are in thermal contact with said thermally conductive platform.

14. The laser module of claim 11, wherein the laser assembly is configured to emit output radiation at a laser emission frequency on a single longitudinal mode.

15. The laser module of claim 1, further including a package defining an enclosure, said package including a base having a surface internal to the enclosure, wherein said thermoelectric cooler is arranged within the enclosure and includes a lower carrier plate being in thermal contact with said internal surface of said base.

16. The laser module of claim 1, wherein said thermoelectric cooler includes a lower carrier plate and a Peltier cell sandwiched between said upper carrier plate and said lower carrier plate of the thermoelectric cooler.

* * * * *